(12) United States Patent
Reisinger et al.

(10) Patent No.: US 6,655,995 B1
(45) Date of Patent: Dec. 2, 2003

(54) ELECTRICAL CONNECTOR RECEPTACLE CAGE WITH INTERLOCKING UPPER AND LOWER SHELLS

(75) Inventors: Jason M'Cheyne Reisinger, Carlisle, PA (US); Michael Eugene Shirk, Grantville, PA (US); James Charles Shiffler, Hummelstown, PA (US); Thomas Edward Lowe, Etters, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 10/208,921

(22) Filed: Jul. 31, 2002

(51) Int. Cl.⁷ ............................................. H01R 13/648
(52) U.S. Cl. ...................................................... 439/607
(58) Field of Search ................................ 439/607, 609, 439/79, 80

(56) References Cited

U.S. PATENT DOCUMENTS

| | | | |
|---|---|---|---|
| 4,847,588 A | 7/1989 | Doutrich | 439/751 |
| 6,364,709 B1 | 4/2002 | Jones | 439/607 |
| 6,368,153 B1 | 4/2002 | Hwang | 439/607 |
| 6,416,361 B1 | 7/2002 | Hwang | 439/607 |
| 6,419,523 B1 | 7/2002 | Jones et al. | 439/607 |
| 6,517,382 B2 * | 2/2003 | Flickinger et al. | 439/607 |
| 6,524,134 B2 * | 2/2003 | Flickinger et al. | 439/607 |

OTHER PUBLICATIONS

"Small Form Factor Pluggable Solder–Down Cage", PicoLight, Rev 5, Apr. 2002, p. 1–5.
"Small Form Factor Pluggable Press–Fit Cage", PicoLight, Rev. 12, Apr. 2002, p. 1–10.
"Small Form Pluggable (SFP) Transceiver MultiSource Agreement (MSA)", Sep. 14, 2000, p. 1–38.
"SPT–RS020B–12", Drawing No. K–510500 (Rev B), drawn by K. Ozai, Jun. 16, 2000, p. 1–13.
"SFP System", Tyco Electronics AMP, Apr. 2000, p. 1–2.
"SFP Cage Assembly 15 Press–Fit Legs and 3 EMI Clips", Molex Incorporated, (Rev B1), Aug. 1, 2000, p. 1–6.
"SFP Cage Assembly 11 Press–Fit Legs and 3 EMI Clips", Molex Incorporated, (Rev. B1), Aug. 1, 2000, p. 1–7.

\* cited by examiner

*Primary Examiner*—Tulsidas Patel (57) ABSTRACT

A small form factor pluggable (SFP) cage is provided having an upper and lower shell. The upper shell has pins configured to fit into a circuit board. The upper shell has a top wall extending between front and back ends, and a rear wall closing the back end. The upper shell also includes side walls extending between the front and back ends and base portions integral with the bottom of the side walls. The base portions are bent inward toward one another. The lower shell has a bottom wall and interlocking members that extended to from a front end of the bottom wall. The upper and lower shells are joined with one another to form a module retention chamber therebetween. The module retention chamber has an open front end configured to accept an SFP module. The interlocking members overlap and inter-connect with the base portions.

22 Claims, 8 Drawing Sheets

ELECTRICAL CONNECTOR RECEPTACLE CAGE WITH INTERLOCKING UPPER AND LOWER SHELLS

RELATED APPLICATIONS

This application is related to application Ser No. 10/209,790 filed on the same date as the present application, titled "Electrical Connector Receptacle With Module Kickout Mechanism", the complete subject matter of which is incorporated herein by reference in its entirety.

BACKGROUND OF THE INVENTION

Certain embodiments of the present invention generally relate to electrical cable assemblies for use with high speed serial data, and more particularly, to electrical connector receptacles for connecting to a circuit board and receiving a plug or small form-factor pluggable module.

In the past, electrical connector receptacles have been proposed for receiving a plug or module which then connects to a host connector which is soldered to a circuit board. The module typically includes a transceiver for either copper or fiber optic based network systems. Conventional connector receptacles have been comprised of one or two pieces. The one piece receptacle or the bottom of the two piece receptacle may be soldered to the circuit board using multiple solder pins. The top piece is then mounted on, and may also be soldered to, the bottom piece. The one and two piece receptacles define an internal space into which the module is inserted. The module is held in place by a mechanical locking mechanism, such as a protrusion from the module, projecting into a hole in the bottom piece.

Alternatively, the receptacle may utilize press fit pins to attach the receptacle to the circuit board. Two piece connector receptacles are first assembled and soldered together either by the manufacturer or the customer, and then press fit onto the circuit board. With both one and two piece receptacles, however, when being press fit onto the circuit board, the pressure often causes the top wall to deflect downward and the side walls to flex, or bow inward. The force of the top and side walls cause the bottom wall to flex upward, away from the circuit board. As a result, the front space into which the module is inserted is deformed.

A need exists for a more robust electrical connector receptacle that improves the strength, rigidity, and ease of installation of the receptacle without sacrificing its electrical performance or latching abilities. It is an object of certain embodiments of the present invention to meet these needs and other objectives that will become apparent from the description and drawings set forth below.

BRIEF SUMMARY OF THE INVENTION

In accordance with at least one embodiment, a small form factor pluggable (SFP) cage is provided having an upper and lower shell. The upper shell has pins configured to fit into a circuit board. The upper shell has a top wall extending between front and back ends, and a rear wall closing the back end. The upper shell also includes side walls extending between the front and back ends and base portions integral with the bottom of the side walls. The base portions are bent inward toward one another. The lower shell has a bottom wall and interlocking members that extend from a front end of the bottom wall. The upper and lower shells are joined with one another to form a module retention chamber therebetween. The module retention chamber has an open front end configured to accept an SFP module. The interlocking members overlap and inter-connect with the base portions.

In accordance with at least one embodiment, a small form factor pluggable (SFP) cage is provided. The SFP cage includes an upper shell and a lower shell. The upper shell has a top wall and side walls extending between front and back ends, and a rear wall closing the back end. The upper shell has base portions integral with the bottom of the side walls that extend parallel to the top wall. Pins are formed integral with, and extend downward from, the side walls to occupy a plane substantially similar to the side walls. The pins are received in a circuit board. Ground members are formed integral with and located proximate the front end of the upper shell. The ground members protrude outward from the upper shell to engage the chassis. The lower shell has interlocking members extending from the front end of a bottom wall. The upper and lower shells are joined to one another and form a module retention chamber having an open front end configured to accept an SFP module.

The foregoing summary, as well as the following detailed description of certain embodiments of the present invention, will be better understood when read in conjunction with the appended drawings. For the purpose of illustrating the preferred embodiments of the present invention, there is shown in the drawings embodiments which are presently preferred. It should be understood, however, that the present invention is not limited to the arrangements and instrumentality shown in the attached drawings.

DETAILED DESCRIPTION OF THE INVENTION

Figure 1:
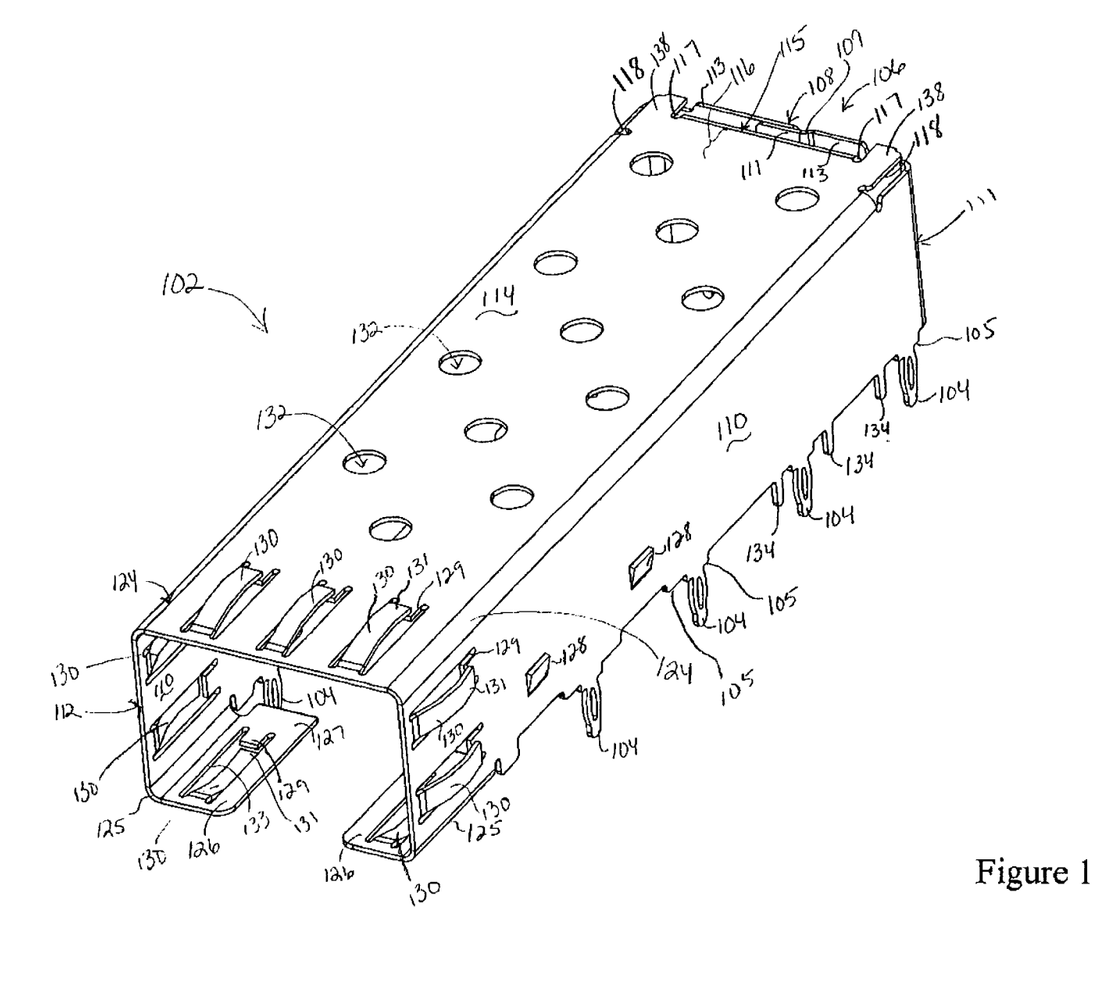
FIG. 1 illustrates an upper shell of a small form-factor (SFP) cage formed of a single piece of sheet material formed in accordance with an embodiment of the present invention.

FIG. 1 illustrates an upper shell 102 of a small form-factor (SFP) cage 100. The upper shell 102 is formed of a single piece of sheet material. The upper shell 102 includes a top wall 114 and two side walls 110. The sheet material is bent along edges 124 between the top wall 114 and the side walls 110. Base portions 126 are bent inward toward one another and up toward the top wall 114, and may be parallel to the top wall 114. The base portions 126 are formed on the bottom edge 125 of the side walls 110 proximate an open front end 112 formed by the front edges of the top wall 114, side walls 110 and base portions 126.

Press fit pins 104 are stamped and formed integral along the bottom edge 125 of the side walls 110. The press fit pins 104 occupy substantially the same plane as the side walls. The press fit pins 104 are formed with an elongated, or oblong shaped, body with an elongated hole in the interior portion, and further comprise shoulders 105 integral with bottom edge 125 which extend out from each side of the press fit pins 104. The press fit pins 104 are snappingly received by, and securely fasten the SFP cage 100 to, a circuit board (not shown). The shoulders 105 rest on the surface of the circuit board, acting as a standoff between the SFP cage 100 and the circuit board.

Electromagnetic interference (EMI) pins 134 are stamped and formed integral along the bottom edge 125 of the side walls 110. The EMI pins 134 may be shorter in length than the press fit pins 104 and are substantially rectangular in shape with a rounded tip. The EMI pins 134 are inserted through holes in the circuit board to penetrate the electrical plane of the circuit board. The EMI pins 134 may or may not contact the circuit board, or may be electrically connected to the circuit board. Alternatively, EMI pins 135 (FIG. 4) may be formed as press fit pins, providing improved mechanical connection between the SFP cage 100 and the circuit board. The EMI pins 135 of FIG. 4 may be narrower in width and the same length as the press fit pins 104. The EMI pins 135 of FIG. 4 may also be wider and longer than the EMI pins 134 illustrated in FIG. 1. Alternatively, press fit pins 104 and/or EMI pins 134, 135 may be formed as solder pins and soldered to the circuit board to form the mechanical and electrical connection therewith. By forming the press fit pins 104 and EMI pins 134, 135 integral with and substantially parallel to the side walls 110 of the upper shell 102, the force applied to the upper shell 102 when mounting the SFP cage 100 on the circuit board does not cause the upper shell 102 or lower shell 148 to deflect, nor deform in shape.

Ground members 130 are stamped and formed proximate the open front end 112 on the front region of the top wall 114, the side walls 110, and the base portions 126. The ground members 130 are biased outward from the top wall 114, side walls 110, and base portions 126 to engage a chassis, bezel, or other grounding structure through which the SFP cage 100 may be inserted. By bending the ground members 130 outward, open windows 133 and tabs 129 are formed in the upper shell 102. The base portions 126 further include a rear portion 127. When the ground members 130 on the base portions 126 are deflected upward by the chassis, the lead edge 131 of the ground member 130 may engage the tab 129. Similarly, tabs 129 on the top wall 114 and side walls 110 may engage corresponding ground members 130 when the SFP cage 100 is mounted in the chassis.

Ventilation holes 132 are stamped out of the top wall 114. Latching features 128 are stamped in side walls 110. The latching features 128 project outward to form a slightly ramped surface with a lance at the top edge. The rear end 115 of the top wall 114 has a pair of inner notches 117 and a pair of outer notches 118 cut therein to define a pair of tabs 138. The tabs 138 may be used to attach the upper shell 102 to a carrier strip during manufacture. The tabs 138 extend toward the rear end 106 of the upper shell 102. Inner notches 117 and outer notches 118 may be parallel to one another. The outer notches 118 define therebetween a flexible portion 116 that cooperates with a kickout spring 136 (FIG. 2) to eject a module.

The back ends 113 of the side walls 110 are bent in towards one another to close the rear end 106 of the upper shell 102. The back ends 113 overlap and form a rear wall 108, enclosing rear end 106. The rear wall 108 is perpendicular to the side walls 110. A portion of a back end 113 is bent inward toward the front end 112 and again away from the front end 112 to form a ridge 109 and an inner portion 111 of the rear wall 108. By forming the rear wall 108 integral with the sides 110 as illustrated, the rear wall 108 may flex outward when a force perpendicular to the rear wall 108 is exerted on rear wall 108. Additionally, by forming rear wall 108 integral with the sides 110, the upper shell 102 is strengthened and more robust, thus unlikely to deform when force is applied to the top wall 114 of the SFP cage 100 when mounting the SFP cage 100 on the circuit board.

Figure 2:
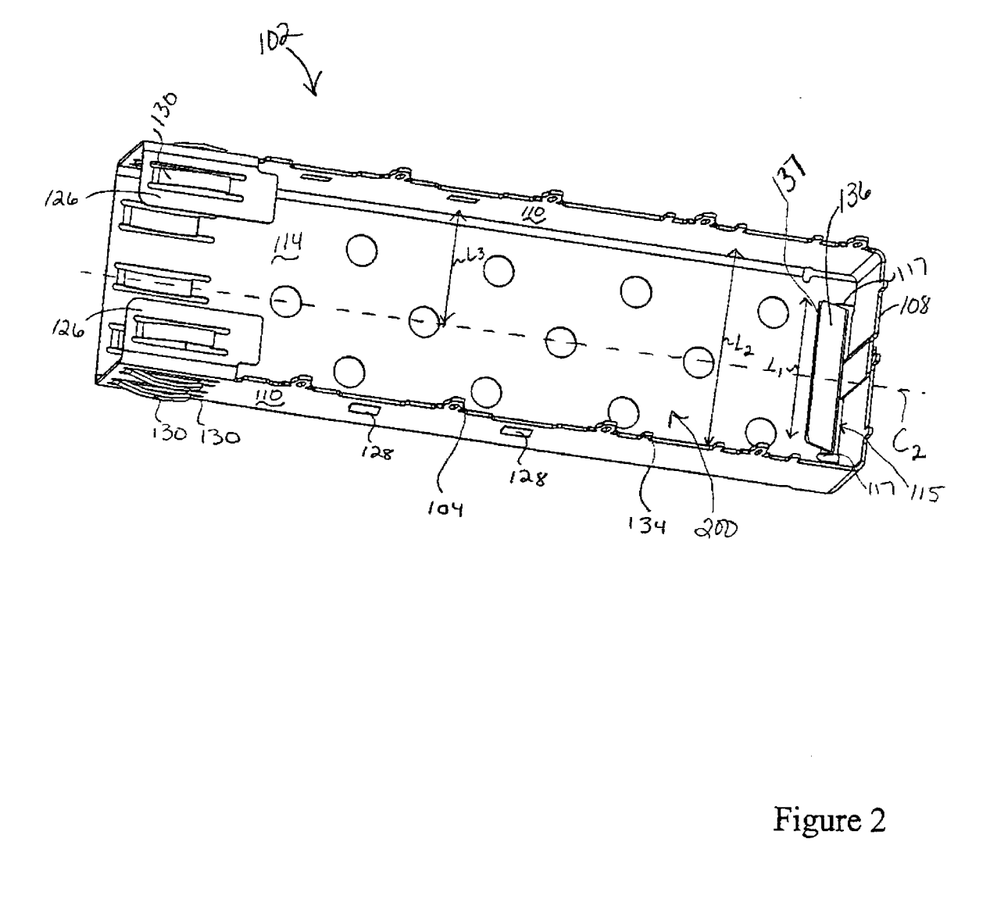
FIG. 2 illustrates a bottom view of the upper shell formed in accordance with an embodiment of the present invention.

FIG. 2 illustrates a bottom view of the upper shell 102. The rear end 115 of the top wall 114 is bent down at an acute angle into the module retention chamber 200 of the upper shell 102 to form kickout spring 136. Kickout spring 136 has a spring width $L_1$ extending between the inner notches 117 which is slightly less than the shell width $L_2$ between the side walls 110. The kickout spring 136 includes a lead edge 137 positioned within the module retention chamber 200 remote from the rear wall 108. $C_2$ illustrates the center line of the upper shell relative to the side walls 110. $L_3$ illustrates the distance from the center line $C_2$ to the side wall 110. $L_3$ is substantially equidistant from the center line $C_2$ to each of the side walls 110 along the length of the upper shell 102. Although the kickout spring 136 is illustrated as integral with the top wall 114 of the upper shell 102, it should be understood that the kickout spring 136 may also be utilized with other SFP cages, such as a one piece SFP cage.

Figure 3:
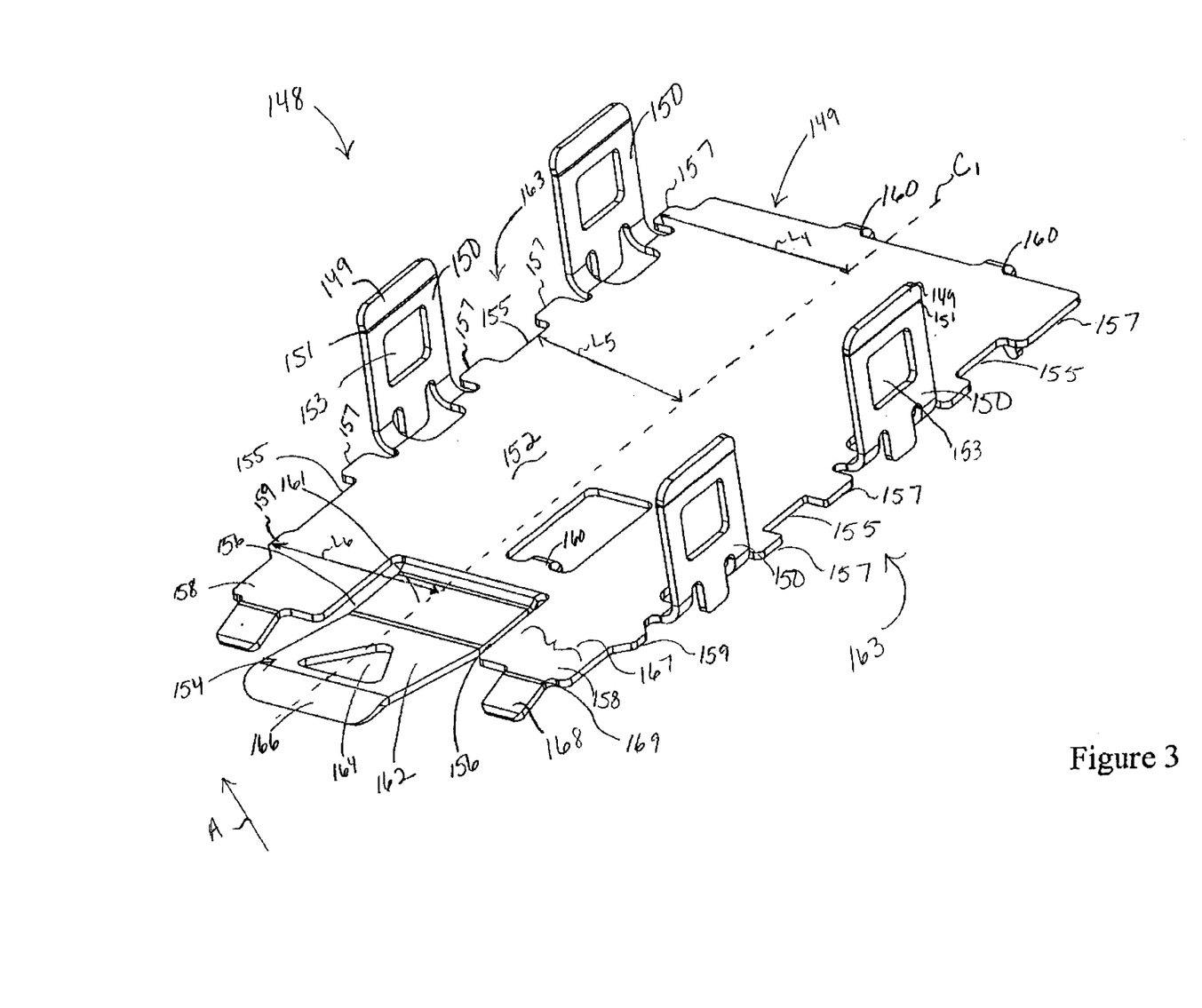
FIG. 3 illustrates a lower shell of an SFP cage formed in accordance with an embodiment of the present invention.

FIG. 3 illustrates a lower shell 148 of the SFP cage 100. The lower shell 148 is bent and formed from one piece of sheet material. Snap over tabs 150 are bent to extend perpendicular to a bottom wall 152. The snap over tabs 150 include an opening 153 and a leading edge 149 at the top end. The leading edge 149 is bent slightly outward at intersection 151. A spring latch 154 and interlocking members 158 protrude from the front edge of the bottom wall 152 to snappably engage a module inserted into the cage 100. The interlocking members 158 comprise a base section 167 and a tip portion 168. The tip portion 168 protrudes from the front end of the base section 167 at the intersection 169 and is narrower in width than the base section 167. The tip portion 168 is bent downward at the intersection 169.

Grooves 156 are cut in the front edge of the bottom wall 152 to separate the spring latch 154 from the interlocking members 158 which are located on either side of the spring latch 154. The spring latch 154 is bent downward and back to form a plateau 161. The plateau 161 occupies a plane parallel to and slightly below the plane of the bottom wall 152 relative to the module retention chamber 200 formed when the upper and lower shells 102 and 148 are joined. Forward of the plateau 161, the spring latch 154 is bent up in the direction of arrow A to form an intermediate portion 162 with a triangular shaped cutout 164. Forward of the triangular shaped cutout 164, the spring latch 154 is bent downward at an obtuse angle to the intermediate portion 162 to form a guiding lip 166.

Notches 155 are cut from the outer edges 163 of the bottom wall 152 towards the center line $C_1$ of lower shell 148. The locations of the notches 155 coincide with the placement of the press fit pins 104 on the upper shell 102. Protrusions 157 extend from the outer edges 163 at other positions, away from the center line $C_1$. The distance $L_4$ from the center line $C_1$ of the lower shell 148 to the protrusions 157 is greater than the distance $L_3$, which is the distance between the side walls 110 and center line $C_2$ of the upper shell 102 (FIG. 2). Therefore, the protrusions 157 may contact and/or extend beyond the bottom edge of side walls 110. In contrast, the distance $L_5$ from the center line $C_1$ of the lower shell 148 to the notches 155 is less than or equal to the distance $L_3$. Thus, the notches 155 may contact the side walls 110 or the press fit pins 104. Protrusions 159 proximate the front of bottom wall 152 are a distance $L_6$ from the center line $C_1$. The distance $L_6$ is less than or equal to $L_3$, allowing the bottom wall 152 at protrusions 159 to fit between the side walls 110. Protrusions 159 may contact the side walls 110.

Figures 6, 7:
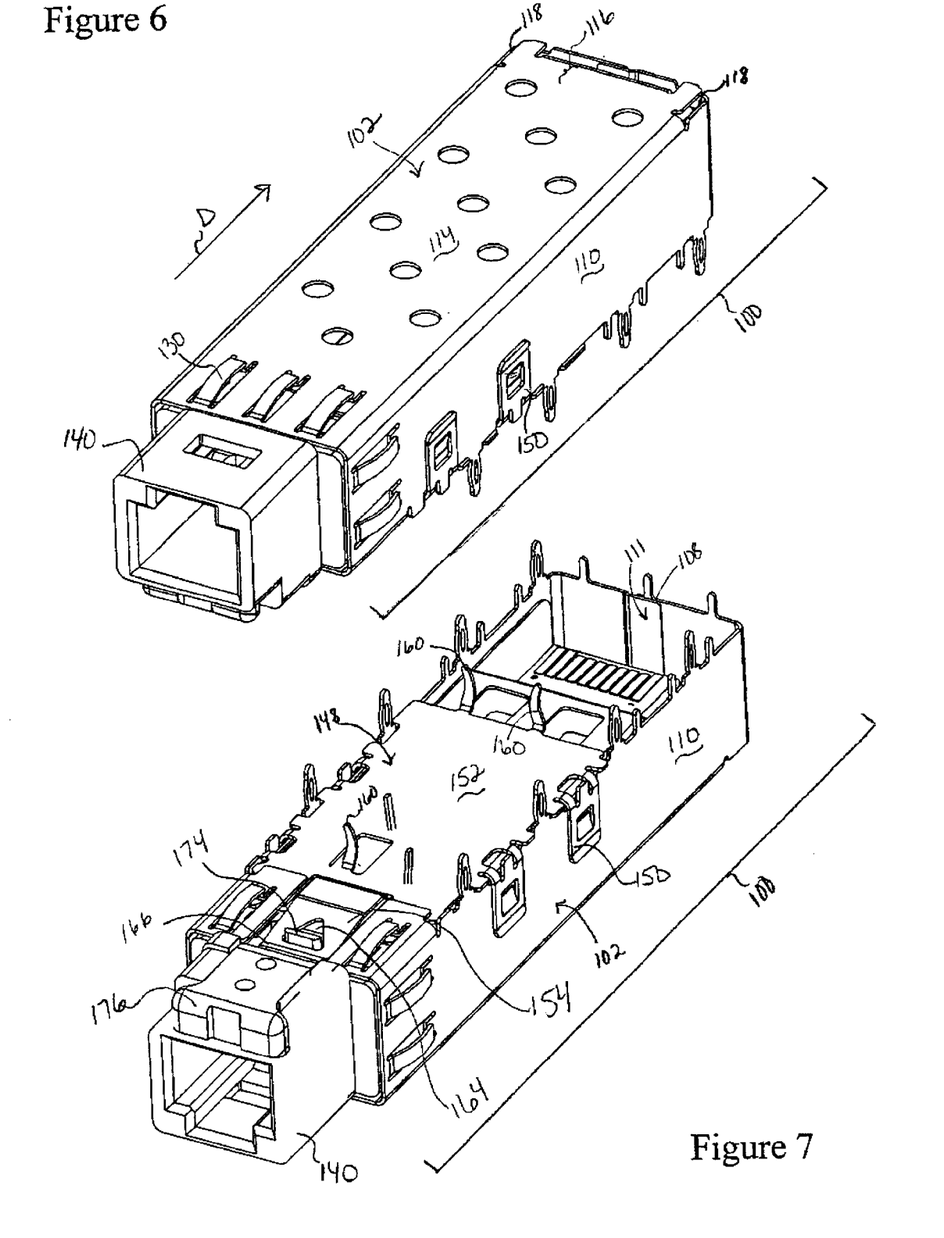
FIG. 6 illustrates a top view of a module inserted into an assembled SFP cage formed in accordance with an embodiment of the present invention.
FIG. 7 illustrates a bottom view of a module inserted into an assembled SFP cage formed in accordance with an embodiment of the present invention.

Two crescent shaped grounding beams 160 protrude from the rear end 149 of the bottom wall 152. A third crescent shaped grounding beam 160 is bent and formed in the central region of the bottom wall 152 behind the spring latch 154. The crescent shaped grounding beams 160 are also illustrated in FIG. 7, which includes a bottom view of the lower shell 148. The grounding beams 160 are integral with the bottom wall 152, and are bent downward and occupy a plane perpendicular to the plane of the bottom wall 152. The grounding beams 160 protruding from the rear end 149 are oriented such that the grounding beams 160 curve away from each other. The grounding beams 160 are inserted into holes in the circuit board to form a grounding connection therewith. The grounding beams 160 may be inserted into the circuit board with less force than the force used to insert press fit pins 104 on upper shell 102. Thus, the lower shell 148 does not deflect when the SFP cage 100 is press fit onto the circuit board.

Figure 4:
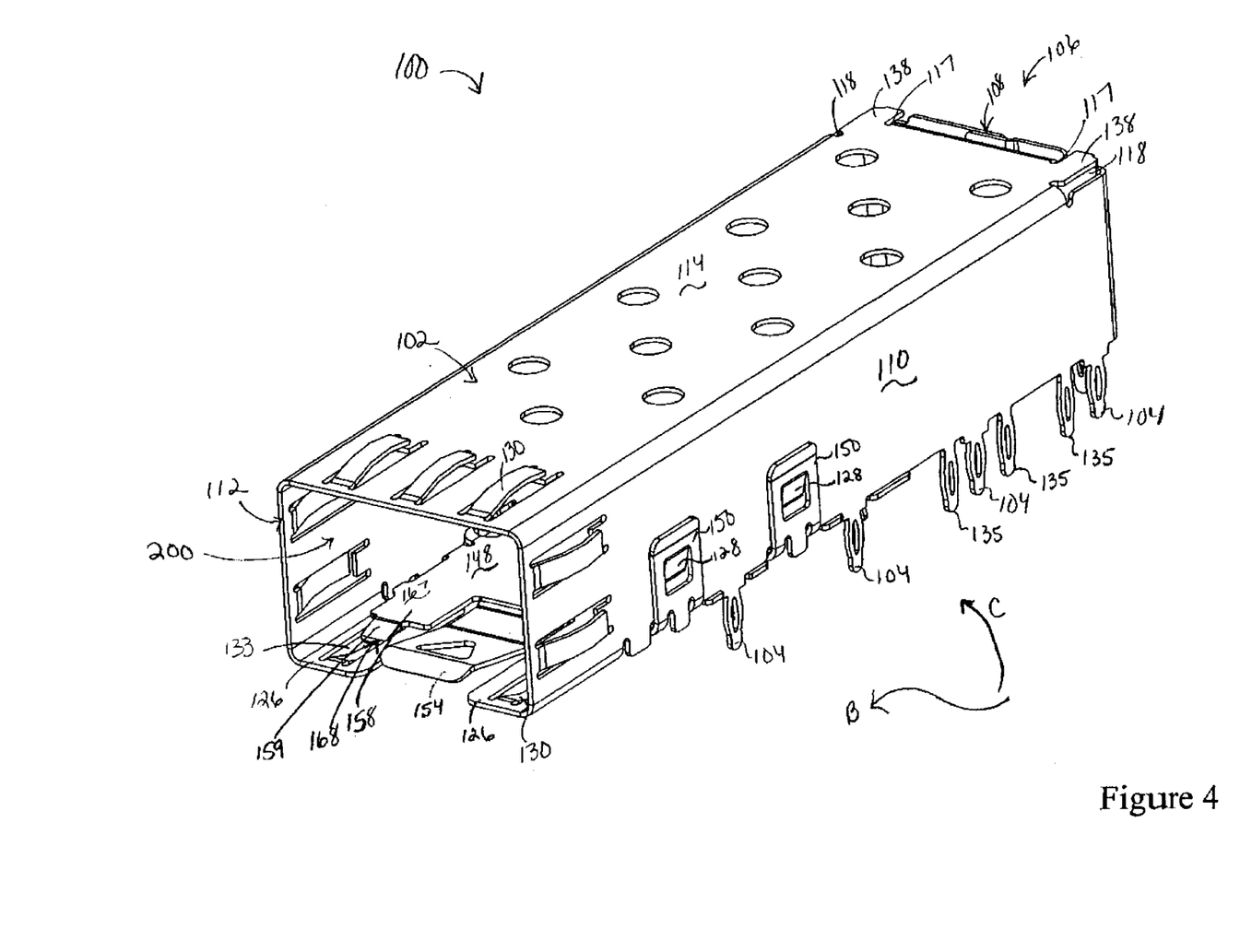
FIG. 4 illustrates an assembled SFP cage formed in accordance with an embodiment of the present invention.

FIG. 4 illustrates an assembled SFP cage 100. The upper shell 102 and lower shell 148 are mated together to form the module retention chamber 200 which is accessible through the open front end 112. As discussed previously, the EMI pins 135 may be press fit pins. Alternatively, the press fit pins 104 and EMI pins 135 may be formed as solder legs, and thus may be soldered to the circuit board.

During assembly, the spring latch 154 on the lower shell 148 is inserted along the path of arrow B into the interior of the upper shell 102 at an acute angle relative to the base portions 126 such that the interlocking members 158 are positioned above the base portions 126, and the spring latch 154 is located between the base portions 126. The press fit pins 104 on the upper shell 102 are positioned interleaved with the snap over tabs 150 on the lower shell 148. The lower shell 148 is then rotated along the path of arrow C in order that the snap over tabs 150 slide along the outside of the upper shell 102 until the snap over tabs 150 engage the latching features 128 on the side walls 110. Therefore, the SFP cage 100 may be assembled without soldering, welding, or other fastening mechanism or process.

The base sections 167 of the interlocking members 158 engage the rear portions 127 of the base portions 126 (FIG. 1) with a downward force. The base sections 167 extend to at least the forward edge of the tab 129 (FIG. 1) on the base portions 126. The tip portion 168 of the interlocking members 158 extends over the tab 129 of the base portions 126 and extends downward into the window 133 formed when the grounding members 130 are stamped. Therefore, when the SFP cage 100 is mounted in a chassis or bezel, and the ground members 130 are engaging the chassis, the downward force of the interlocking members 158 of the lower shell 148 on the base portions 126 of the upper shell 102 prevents the base portions 126 from deflecting upward into the module retention chamber 200, and the tip portion 168 engages the inner edges of the window 133, preventing the side walls 110 from being deformed inward.

Figure 8:
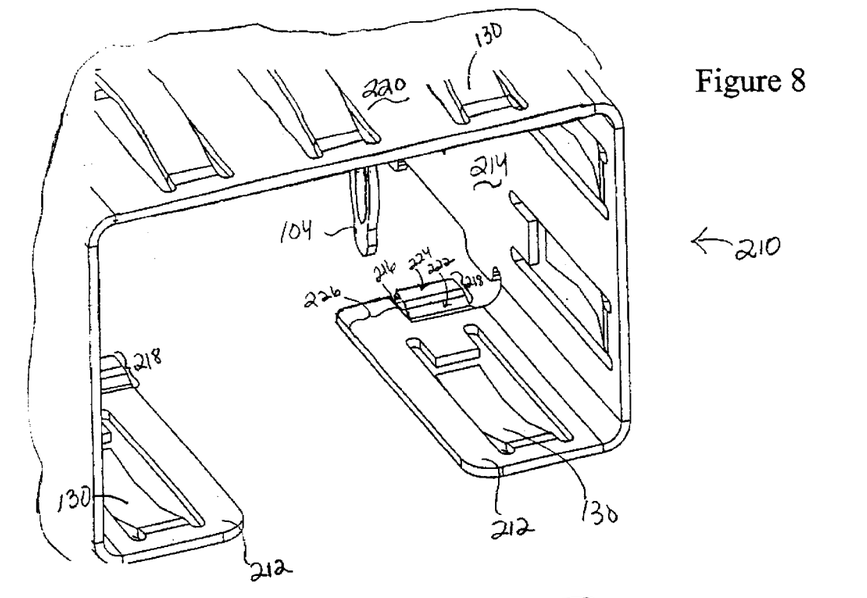
FIG. 8 illustrates the interlocking features of an upper shell of an SFP cage formed in accordance with an embodiment of the present invention.
Figure 9:
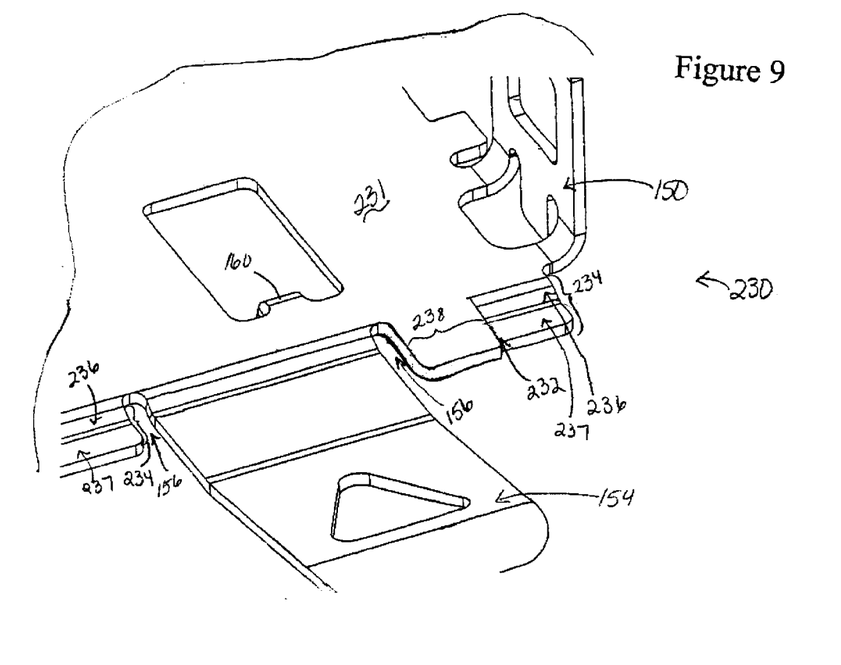
FIG. 9 illustrates the interlocking features of a lower shell of an SFP cage formed in accordance with an embodiment of the present invention.
Figure 10:
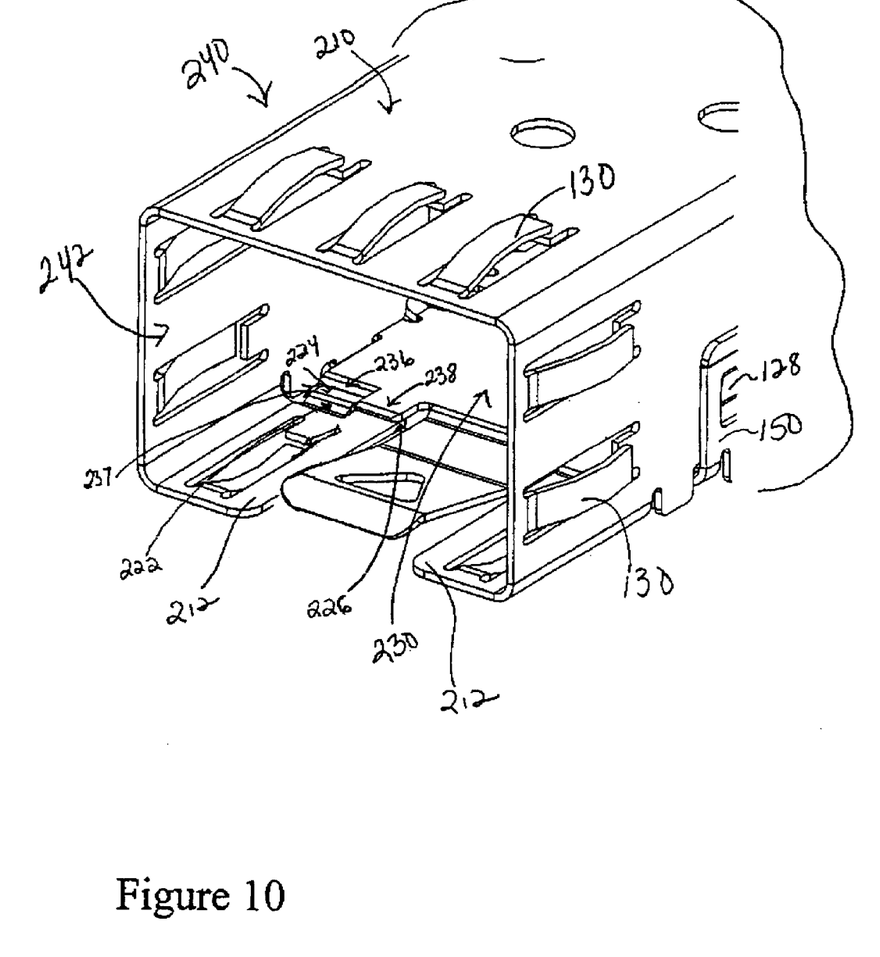
FIG. 10 illustrates an assembled SFP cage utilizing the interlocking features of FIGS. 8 and 9 formed in accordance with an embodiment of the present invention.

FIG. 8 illustrates an alternative embodiment of the interlocking features of upper shell 210. Features previously discussed are illustrated in FIGS. 8-10 using the aforementioned item numbers. Upper shell 210 includes base portions 212 formed integral with side walls 214. Base portions 212 include a notch or shear 216 cut in the back end of base portions 212. An upper tab 218 is bent and formed integral with base portions 212 and adjacent to the shear 216. Upper tab 218 is bent toward top wall 220 to form a ramped surface 222. Upper tab 218 is then bent away from top wall 220 to form a plateau 224 substantially parallel to base portions 212. Back end 226 is adjacent to the shear 216 and occupies the same plane as the base portions 212.

FIG. 9 illustrates an alternative embodiment of the interlocking features of lower shell 230. The bottom wall 231 includes a notch or shear 232 cut in the front edge. Lower tab 234 is integral with bottom wall 231 and is bent and formed adjacent to the shear 232. Lower tab 234 is bent downward to form ramped surface 236, then bent upwards to form a plateau 237 substantially parallel to bottom wall 231. Front portion 238 is adjacent to the shear 232 and occupies the same plane as bottom wall 231.

FIG. 10 illustrates an assembled SFP cage 240 utilizing the interlocking features of upper shell 210 and lower shell 230. Upper shell 210 and lower shell 230 are mated together in a manner similar to SFP cage 100 of FIG. 4, forming a front opening 242. However, the plateau 224 of upper tab 218 extends over, touches and may press upon the plateau 237 of lower tab 234, and front portion 238 extends partially over, touches and may press upon a portion of the back end 226. Therefore, upper and lower tabs 218 and 234, combined with front portion 238 and back end 226, prevent the front opening 242 from being deformed from side, top, and/or bottom forces when the SFP cage 240 is mounted in a chassis or bezel. As illustrated in FIGS. 8 and 9, the interlocking features may be symmetrical, wherein upper and lower tabs 218 and 234 are formed on each side of the upper and lower shells 210 and 230 in the same orientation from left to right. Alternatively, as illustrated in FIG. 10, the interlocking features may be asymmetrical, wherein upper and lower tabs 218 and 234 are both formed closer to the side walls 214, or closer to the center of SFP cage 240.

Figure 5:
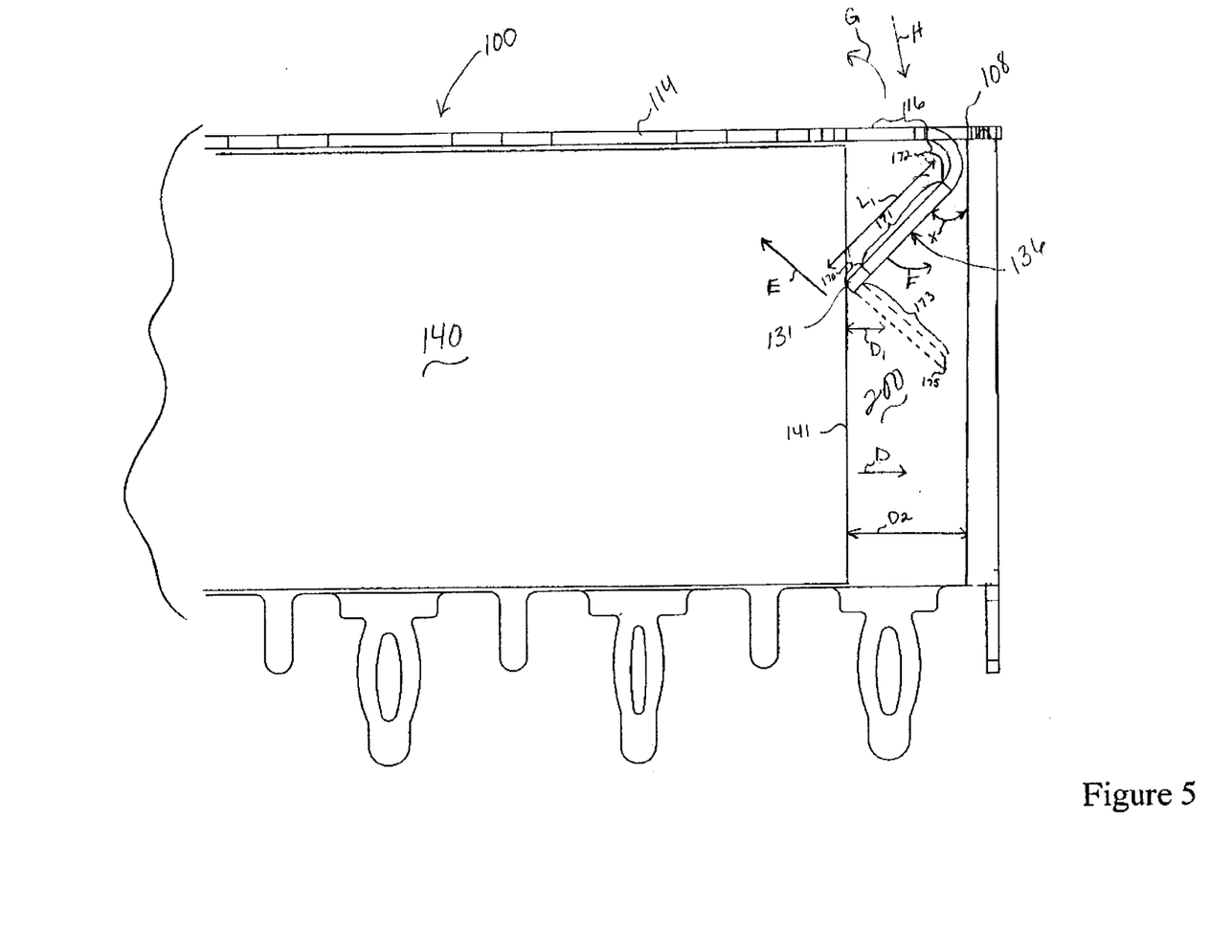
FIG. 5 illustrates a side view of the kickout spring and a portion of the SFP cage with an SFP module inserted formed in accordance with an embodiment of the present invention.

FIG. 5 illustrates a side view of the kickout spring 136 and a portion of the SFP cage 100 with an SFP module 140 inserted. The kickout spring 136 comprises a module engaging portion 170 integral with a lever portion 171 that projects downward and into the module retention chamber 200 to engage a plug or SFP module 140 at lead edge 131. The kickout spring 136 also includes a radiused portion 172. The radiused portion 172 is integral with the flexible section 116 proximate the back end of the top wall 114, and may not engage rear wall 108 when kickout spring 136 is at rest. When no force is applied to the kickout spring 136, the lever portion 171 rests at an acute angle X relative to the rear wall 108. Also, kickout spring 136 occupies a space proximate the rear wall 108 with the lead edge 131 located a distance $D_2$ from the rear wall 108, such that a module 140 cannot be locked into the SFP cage 100 without deflecting the kickout spring 136. Alternatively, kickout spring 136 may extend beyond lead edge 131. Kickout spring 136 may be bent downward and toward rear wall 108 to form rear wall engaging portion 173. The outer end 175 of the rear wall engaging portion 173 may be rounded slightly.

FIGS. 6 and 7 illustrate top and bottom views, respectively, of a module 140 inserted into an assembled SFP cage 100. FIGS. 5–7 will be discussed together.

When the module 140 is inserted into the module retention chamber 200 in the direction of arrow D, the back wall 141 of the module 140 engages the lead edge 131 of the module engaging portion 170 of the kickout spring 136. As the insertion force from the module 140 in the direction of arrow D overcomes the spring force in the direction of arrow E created by the kickout spring 136, the kickout spring 136 deflects in the arcuate direction of arrow F towards the rear and top walls 108 and 114. For example, the module engaging portion 170 may be deflected a distance $D_1$ as measured from the position of the lead edge 131 when in its resting position. As the kickout spring 136 deflects, the radiused portion 172 flexes up and back, and may contact and deflect the rear wall 108 outward. As a result, the angle X becomes smaller. Also, the flexible section 116 of the top wall 114 between outer notches 118 bends upward and away from the plane of the top wall 114 in the direction of arrow G. The resiliency and memory of the flexible section 116 is enhanced by the length $L_1$ of the kickout spring 136. Optionally, if kickout spring 136 includes the rear wall engaging portion 173, the outer end 175 may contact and deflect rear wall 108 outward with a force in the direction of arrow D.

The module 140 is pushed in the direction of arrow D until the module latch 174 (FIG. 7) slides under the guiding lip 166 on the spring latch 154 and engages the cutout 164. When securely latched, the release button 176 of the module 140 is fully extended towards the front end of the module 140 and fits under the guiding lip 166 of the spring latch 154. The module latch 174 and cutout 164 securely hold the module 140 and SFP cage 100 mated together while the module engaging portion 170 exerts a potential force on the back wall 141 of the module 140. It should be understood that other latching mechanisms may be used to secure the module 140 inside SFP cage 100.

To unlatch the module 140 from the SFP cage 100, the release button 176 is pressed towards the rear wall 108 of SFP cage 100, in the direction of arrow D. The release button 176 slides under the spring latch 154 and deflects the spring latch 154 out and away from bottom wall 152 until the module latch 174 is no longer engaged by the cutout 164. The flexible section 116 exerts a force in direction H, the rear wall 108, module engaging portion 170 and lever portion 171 exert force in the direction E. The directions E and H and the force exerted may vary depending upon the length of the kickout spring 136, the angle X, the sheet material used to constrict the upper shell 102, and the like. The module 140 is ejected at least the distance D1 out of the SFP cage 100 by the forces, and the kickout spring 136 returns to its original location at angle X relative to the rear wall 108.

The force of the kickout spring 136 combined with the forces from the flexible section 116 and rear wall 108 provides sufficient, reliable force to eject the module 140. Furthermore, the kickout spring 136 is larger than previous kickout springs as discussed previously, and thus is better able to retain its memory and resiliency when modules 140 are inserted and ejected multiple times.

The SFP cage 100 provides improved strength and rigidity. The ground members 130 are located on the upper shell 102 which defines the open front end 112. The interlocking features of the upper and lower shells 102 and 148, such the base portions 126, base sections 167 and tip portions 168 (FIGS. 1–4), and upper and lower tabs 218 and 234, front portions 238 and back ends 226 (FIGS. 8–10), prevent the open front end 112 from being deformed when mounting the SFP cage 100 on a circuit board and/or in a chassis or bezel. By locating the press fit pins 104 and EMI pins 134, 135 integral with and parallel to the side walls 110 of the upper shell 102 rather than on the lower shell 148 of the SFP cage 100 or on a single piece SFP cage, the side walls 110 are not deformed when the SFP cage 100 is press fit on a circuit board. Furthermore, by forming the closed back end 106 integral with and perpendicular to the side walls 110, increased rigidity of the upper shell 102 is achieved.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An electrical connector receptacle cage, comprising:
an upper shell having pins extending therefrom that are configured to fit into a circuit board, said upper shell having a top wall extending between front and back ends, said upper shell having a rear wall closing said back end and having side walls extending between said front and back ends, said upper shell having base portions formed integral with a bottom edge of said side walls and bent inward toward one another; and
a lower shell having a bottom wall and interlocking members extending from a front end of said bottom wall, said upper and lower shells joining with one another to form a module retention chamber therebetween, said module retention chamber having an open front end configured to accept a module, said interlocking members of said lower shell overlapping and inter-connecting with said base portions of said upper shell.

2. The cage of claim 1, said lower shell further including snap over tabs formed integral with said bottom wall, said snap over tabs being bent upward to engage an exterior of said side walls.

3. The cage of claim 1, said lower shell further including snap over tabs formed integral with said bottom wall, said upper shell further including tab protrusions formed integral with said side walls, said snap over tabs sliding over and inter-connecting with said tab protrusions when said upper and lower shells are joined to one another.

4. The cage of claim 1, said upper shell further comprising electromagnetic interference (EMI) pins formed integral with, and directed downward from, said side walls, said EMI pins being formed with a substantially rectangular body configured to fit into holes in a circuit board.

5. The cage of claim 1, said interlocking members further comprising a base section and a finger, said finger projecting from a forward edge of said base section, bottom surfaces of said base sections contacting and resting upon said base portions when said upper and lower shells are joined to one another.

6. The cage of claim 1, wherein said interlocking members include fingers projecting therefrom and wherein said base portions include windows that snappingly receive said fingers when said upper and lower shells are joined.

7. The cage of claim 1, said upper shell further comprising a plurality of ground members located proximate and surrounding said front end, said ground members being formed integral with said upper shell and protruding outward to be configured to engage a conductive chassis.

8. The cage of claim 1, said base portions further comprising at least one ground member stamped therein and protruding outward to form windows, said interlocking members projecting into said windows in said upper shell.

9. The cage of claim 1, wherein said interlocking member includes a plateau located between inner facing edges of said base portions to resist inward lateral movement of said base portions.

10. The cage of claim 1, said rear wall being formed from first and second back sections of said side walls, wherein a first side wall is bent inward toward said module retention chamber and is bent to form first and second portions occupying first and second parallel planes, respectively, wherein a second side wall is bent inward toward said module retention chamber and aligned to occupy said first parallel plane and overlap said second portion.

11. The cage of claim 1, said side walls being folded inward toward said module retention chamber until overlapping to form said rear wall.

12. The cage of claim 1, wherein said interlocking members contact said base portions and prevent said side walls from being deformed inward toward said module retention chamber when said cage is mounted in a grounding structure.

13. The cage of claim 1, said lower shell further comprising a plurality of kinked leg contact pins, said kinked leg contact pins projecting away from said module retention chamber, said kinked leg contact pins being configured to form a connection with a circuit board, two said kinked leg contact pins being oriented to curve away from each other.

14. The cage of claim 1, further comprising:

protrusions on an outer edge of said bottom wall, said protrusions extending away from said module retention chamber to overlap an outer surface of said side walls; and notches on said outer edge of said bottom wall, said notches extending toward said module retention chamber, said outer edge at said notches being interior to an inner surface of said side walls.

15. The cage of claim 1, said lower shell further comprising a plurality of kinked leg contact pins, said kinked leg contact pins projecting away from said module retention chamber, two said kinked leg contact pins being located within a single plane perpendicular to said bottom wall, said two said kinked leg contact pins curving in opposite directions.

16. A small form-factor pluggable (SFP) cage, comprising:

an upper shell having a top wall extending between front and back ends, said upper shell having a rear wall closing said back end and having side walls extending between said front and back ends, said upper shell having base portions integral with bottoms of said side walls and extending parallel to said top wall;

pins extending downward from said side walls, said pins being formed integral with said side walls;

ground members formed integral with said upper shell, said ground members being located proximate said front end, said ground members protruding outward from said upper shell; and a lower shell having a bottom wall and interlocking members extending from a front end of said bottom wall, said interlocking members snappably engaging said base portions of said upper shell, said upper and lower shells joined to one another to form a module retention chamber, said module retention chamber having an open front end, said module retention chamber being configured to accept an SFP module.

17. The SFP cage of claim 16, said pins further comprising a first group of pins formed of an oblong body with an internal hole and a second group of pins formed of a rectangular body with a rounded tip at an outer end, said first group of pins being configured to be snappingly received in holes in a circuit board.

18. The SFP cage of claim 16, said pins formed of an elongated body with an elongated internal hole, said pins being press fit into holes in a circuit board, a portion of said pins electrically engaging the circuit board.

19. The SFP cage of claim 16, said pins formed of a rectangular body, said pins being placed in holes in a circuit board and soldered to said circuit board.

20. The SFP cage of claim 16, said base portions further comprising at least one ground member stamped therein and protruding outward to form windows, said interlocking members projecting into windows in said upper shell.

21. The SFP cage of claim 16, further comprising:

said base portions further comprising at least one upper tab being bent towards said module retention chamber; and said lower shell further comprising at least one lower tab being bent away from said module retention chamber, said at least one lower tab sliding under said at least one upper tab when said upper and lower shells are joined together.

22. The SFP cage of claim 16, further comprising:

said base portions further comprising at least one upper tab being bent towards said module retention chamber and at least one top tab occupying substantially the same plane as said base portions; and said lower shell further comprising at least one lower tab being bent away from said module retention chamber and at least one bottom tab occupying substantially the same plane as said bottom wall, a portion of said lower tab sliding under a portion of said upper tab and a portions of said bottom tab sliding over a portion of said top tab when said upper and lower shells are joined together.

* * * * *